United States Patent [19]

Gonsiorawski

[11] Patent Number: 5,011,567
[45] Date of Patent: Apr. 30, 1991

[54] METHOD OF FABRICATING SOLAR CELLS

[75] Inventor: Ronald C. Gonsiorawski, Danvers, Mass.

[73] Assignee: Mobil Solar Energy Corporation, Billerica, Mass.

[21] Appl. No.: 555,659

[22] Filed: Jul. 17, 1990

Related U.S. Application Data

[63] Continuation of Ser. No. 447,211, Dec. 6, 1989, abandoned.

[51] Int. Cl.$^5$ .................. H01L 71/306; B44C 1/22; C03C 15/00; C03C 25/06
[52] U.S. Cl. ............................ 156/643; 156/644; 156/653; 156/657; 156/662; 219/121.69; 219/121.85; 437/4; 437/228
[58] Field of Search ............ 156/643, 644, 652, 653, 156/657, 659.1, 662; 437/23.4, 173, 228, 230, 238, 241, 245; 136/256; 219/121.68, 121.69, 121.85; 357/30; 427/53.1, 74; 252/79.2, 79.3, 79.4

[56] References Cited

U.S. PATENT DOCUMENTS

| | | | |
|---|---|---|---|
| Re. 27,772 | 10/1973 | Hanfmann | 219/121.85 |
| 4,044,222 | 8/1977 | Kestenbaum | 219/121.85 |
| 4,081,653 | 3/1978 | Koo et al. | 219/121.85 |
| 4,321,283 | 3/1982 | Patel et al. | 427/74 |
| 4,331,504 | 5/1982 | Chuang et al. | 156/635 |
| 4,335,295 | 6/1982 | Fowler | 219/121.85 |
| 4,388,145 | 6/1983 | Hawkins et al. | 156/617 R |
| 4,401,367 | 8/1983 | Grantham et al. | 350/162.22 |
| 4,415,383 | 11/1983 | Naem et al. | 156/643 X |
| 4,451,969 | 6/1984 | Chaudhuri | 136/256 X |
| 4,478,677 | 10/1984 | Chen et al. | 156/635 |
| 4,490,210 | 12/1984 | Chen et al. | 156/643 |
| 4,490,211 | 12/1984 | Chen et al. | 156/643 |
| 4,557,037 | 12/1985 | Hanoka et al. | 136/256 X |
| 4,612,698 | 9/1986 | Gonsiorawski | 136/256 X |

OTHER PUBLICATIONS

Green et al., "Improvements in Flat-Plate and Concentrator Silicon Cell Efficiency", *IEEE*, 1987, pp. 49–52.

*Primary Examiner*—William A. Powell

[57] ABSTRACT

A method of forming a metallization pattern on a solar cell substrate having an outer layer of a selected dielectric such as silicon nitride, silicon dioxide, or glass, by removing selected portions of the dielectric layer with a laser beam. This laser exposure drives portions of the P/N junction positioned beneath the exposed regions of the substrate more deeply into the substrate. Removal of selected portions of the dielectric layer exposes regions of the silicon substrate on which conductors may be deposited by conventional immersion plating methods. This laser removal of the dielectric layer is effected in an environment substantially free of chemical etching substances. Following removal of the selected portions of the dielectric layer, the substrate is preferably immersed in a buffered oxide etch solution to remove residual silicon dioxide and is then preferably immersed in a high ratio (nitric acid to hydrofluoric acid) etch solution to remove residual silicon nitride. The method of forming a metallization pattern may be incorporated into a comprehensive solar cell fabrication process.

31 Claims, 3 Drawing Sheets

STARTING MATERIAL

LASER ETCHING

BUFFERED OXIDE ETCH

300:1 ETCH

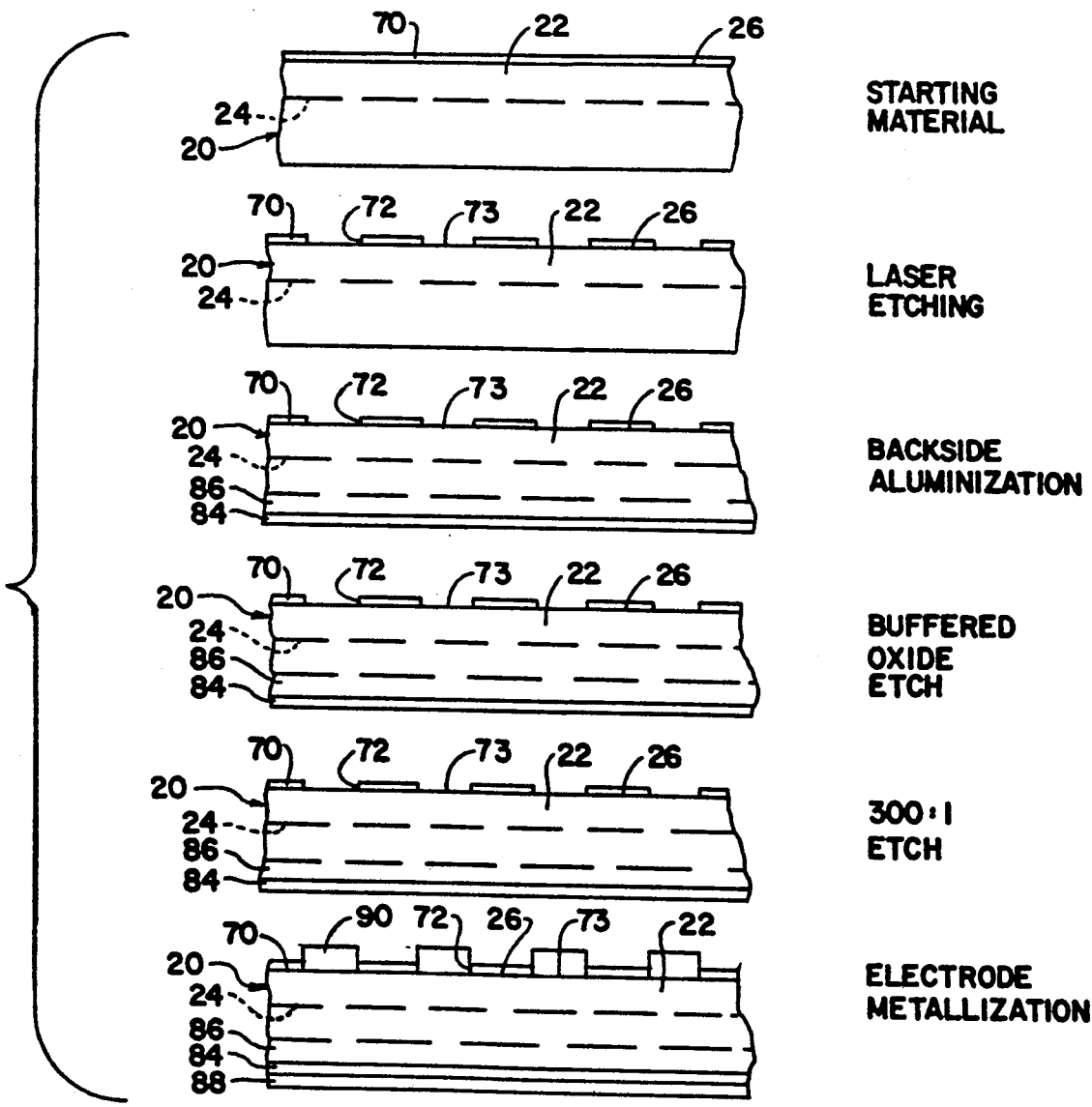

METHOD OF FABRICATING SOLAR CELLS

This application is a continuation of application Ser. No. 07/447,211, filed Dec. 6, 1989, now abandoned.

BACKGROUND OF THE INVENTION

1. Field of Invention

This invention relates generally to the fabrication of semiconductor devices and more particularly to a method of forming metallization patterns in a dielectric layer of a substrate for a photovoltaic cell by laser scanning selected regions of the substrate in an atmosphere substantially free of chemical etching substances The dielectric layer may consist of a glass or a silicon nitride layer.

2. Prior Art

Known semiconductor devices, such as photovoltaic cells, frequently comprise a plurality of conductive metallic segments attached to the front surface of a selected substrate for conducting current between various regions of the device. In the fabrication of such semiconductor devices, a plurality of relatively involved processing steps are typically required to prepare the surface of the substrate for metallization formation of the front surface conductors. These processing steps are required because the front surface of the substrate of conventional semiconductor devices is typically coated with a layer of material to which conductive materials deposited by known methods, e.g., the immersion plating process disclosed in U.S. Pat. No. 4321283, will not readily adhere. This front surface layer is typically a dielectric layer, e.g., a glass or silicon nitride layer. The glass and silicon nitride layers provide hard protective coatings for the underlying silicon substrate.

Conventionally, metallization patterns are formed by selectively removing portions of the dielectric front surface layer using known photoresist and etching methods. Selected portions (depending on the process used) of the front surface of the substrate define the regions to which conductors will be attached Examples of known solar cell photoresist and etching methods are taught in U.S. Pat. Nos. 4451969, 4557037, and 4612698.

Prior known methods of forming metallization patterns are not entirely satisfactory because they involve a relatively large number of processing steps. For instance, in U.S. Pat. No. 4451969, relating to the production of solar cells, the following steps are required to prepare a photovoltaic cell silicon substrate for metal plating:

(a) forming a polysilazane coating on a first surface of the substrate having a junction in the substrate adjacent the first surface;

(b) covering the polysilazane coating with a photoresistant material;

(c) exposing the photoresist coating to radiant energy through a mask defining a two-dimensional pattern;

(d) chemically developing the photoresist so that selected portions of the photoresist are removed according to the two-dimensional pattern;

(e) etching away those portions of the polysilazane coating not covered by the photoresist; and (f) heating the silicon substrate at a temperature and for a time sufficient to:

(1) effect removal of said photoresist material by pyrolysis, and (2) modify said polysilazane coating so that it has a relatively low etch rate.

Since the cost of semiconductor devices such as solar cells is dependent to a major extent upon the number of required fabrication steps, it is clearly desirable to be able to form metallization patterns using a process having fewer steps than the foregoing process.

Lasers have been used to remove or alter the microstructure of various layers on substrates of semiconductor devices, in part, as a method of reducing the number of steps involved in fabricating the device For instance, lasers have been used in conjunction with etchants to remove selected portions of semiconductor materials, as taught, for instance, in U.S. Pat. Nos. 4331504, 4401367, 4478677, 4490210, and 4490211. Lasers have also been used to alter the microstructure of portions of semiconductor materials to facilitate subsequent removal of the laser-scanned portions by specific surface etchants, as disclosed in U.S. Pat. Nos. 4335295 and 4415383. It also is known to cut holes by laser beam in thin films such as silicon nitride, copper and other conductor and semiconductor materials, as shown, for example, by U.S. Pat. Nos. Re: 27772, 4044222 and 4081653. Lasers have also been used to anneal predetermined areas of amorphous or polycrystalline semiconductor materials into single crystal areas, as disclosed by U.S. Pat. No. 4388145.

Prior known methods of removing or altering the microstructure of electrical conductor or semiconductor materials using lasers are not directed to the production of metallization patterns in dielectric layers on silicon solar cells. Additionally, some of the known laser processing methods require the use of one or more surface-reactive etching agents. The use of such agents adds to the cost of fabrication of semiconductor devices and often presents additional storage and waste disposal problems.

A method of removing selected portions of the silicon nitride layer of a semiconductor substrate so as to expose the underlying silicon substrate using a laser beam in an environment that is substantially free of chemical etching substances is disclosed in U.S. Patent Application Ser. No. 387,854, filed on July 31, 1989 in the name of Hanoka et al (Attorney's Docket No. MTA-73). Although functional solar cells were fabricated in accordance with the Hanoka et al. process, it has been determined that conductors attached to the exposed portions of the silicon substrate do not always adhere as securely and as permanently as might be desired. It appears that a small amount of silicon nitride tends to remain or is redeposited on the portions of the silicon substrate exposed by laser removal of the selected portions of the silicon nitride layer. This residual silicon nitride is believed to adversely affect the adhesion of the conductors to the substrate.

OBJECTS OF THE INVENTION

A principal object of the present invention is to provide a method of fabricating solar cells having a discrete dielectric outer layer wherein conductor metallization patterns are formed by removing selected portions of the dielectric outer layer by means of a laser beam and a subsequent chemical etch.

Another object of the present invention is to provide a method of forming complex conductor metallization patterns on a semiconductor substrate in relatively few steps and at a relatively high rate of speed.

Yet another object of the present invention is to provide a method of physically removing selected portions of the dielectric layer of a semiconductor substrate so that conductors can be securely and permanently attached to the underlying silicon substrate exposed by removal of the selected portions of the dielectric layer.

Still another object of the present invention is to provide a method of forming complex metallization patterns on a semiconductor substrate having an outer dielectric layer by removing selected regions of the outer dielectric layer so as to expose the underlying substrate and at the same time increasing the depth of the junction beneath the exposed regions.

Yet another object of the present invention is to provide a method of forming a metallized electrode grid on a solar cell which electrode grid is configured to minimize the shadow it casts on the surface of the solar cell.

Still another object of the present invention is to provide a method of forming a solar cell having reduced recombination losses, which reduction is achieved by driving the junction beneath the electrode grid deeper into the substrate and by reducing the metal to silicon contact area of the electrode grid.

Other objects of the invention are set forth in or rendered obvious by the following detailed description of the invention.

SUMMARY OF THE INVENTION

The foregoing objects are realized by a process which, in a preferred embodiment as applied to the fabrication of crystalline silicon solar cells preferably involves, inter alia, the following steps:

(a) providing a solar cell substrate having a dielectric layer on a first surface of the cell and a P/N junction disposed within said cell adjacent the first surface;

(b) removing selected portions of the dielectric layer by laser ablation so as to expose regions of the first surface to which conductors will subsequently be attached by plating, this removal being done so as to avoid forming apertures in the substrate extending through the P/N junction;

(c) immersing the substrate in a buffered oxide etch for a selected period of time, and then removing the substrate and rinsing the latter with de-ionized water; and (d) immersing the substrate in a high ratio nitric acid/hydrofluoric acid etch for a selected period of time, and then removing the substrate and rinsing the latter with de-ionized water.

As discussed below, in certain cases steps (c) and (d) are not required.

As also discussed below, the laser treatment of step (b) tends to drive the junction more deeply into the substrate beneath those regions of the substrate exposed by removal of the selected portions of the outer dielectric layer.

As used herein the term "immersion plating" means a process wherein an object is plated with a metal without the use of an externally applied electric field by immersing that object in a plating bath that does not contain a reducing agent, and the plating involves a displacement reaction. Immersion plating is distinguished from electroless plating in that the latter involves a plating bath that contains a reducing agent. An exemplary immersion plating method is disclosed in U.S. Pat. No. 4321283 to Patel et al.

BRIEF DESCRIPTION OF THE DRAWINGS

FIG. 2 is a schematic diagram showing the relationship between the photovoltaic cell substrate and the laser used in performing the present invention;

FIG. 3 illustrates the several steps involved in fabricating a photovoltaic cell using the method of forming a pattern for metallization illustrated in FIG. 1.

For convenience of illustration, the thicknesses and depths of the several coatings and regions are not drawn to scale.

DETAILED DESCRIPTION OF THE INVENTION

Figure 1:
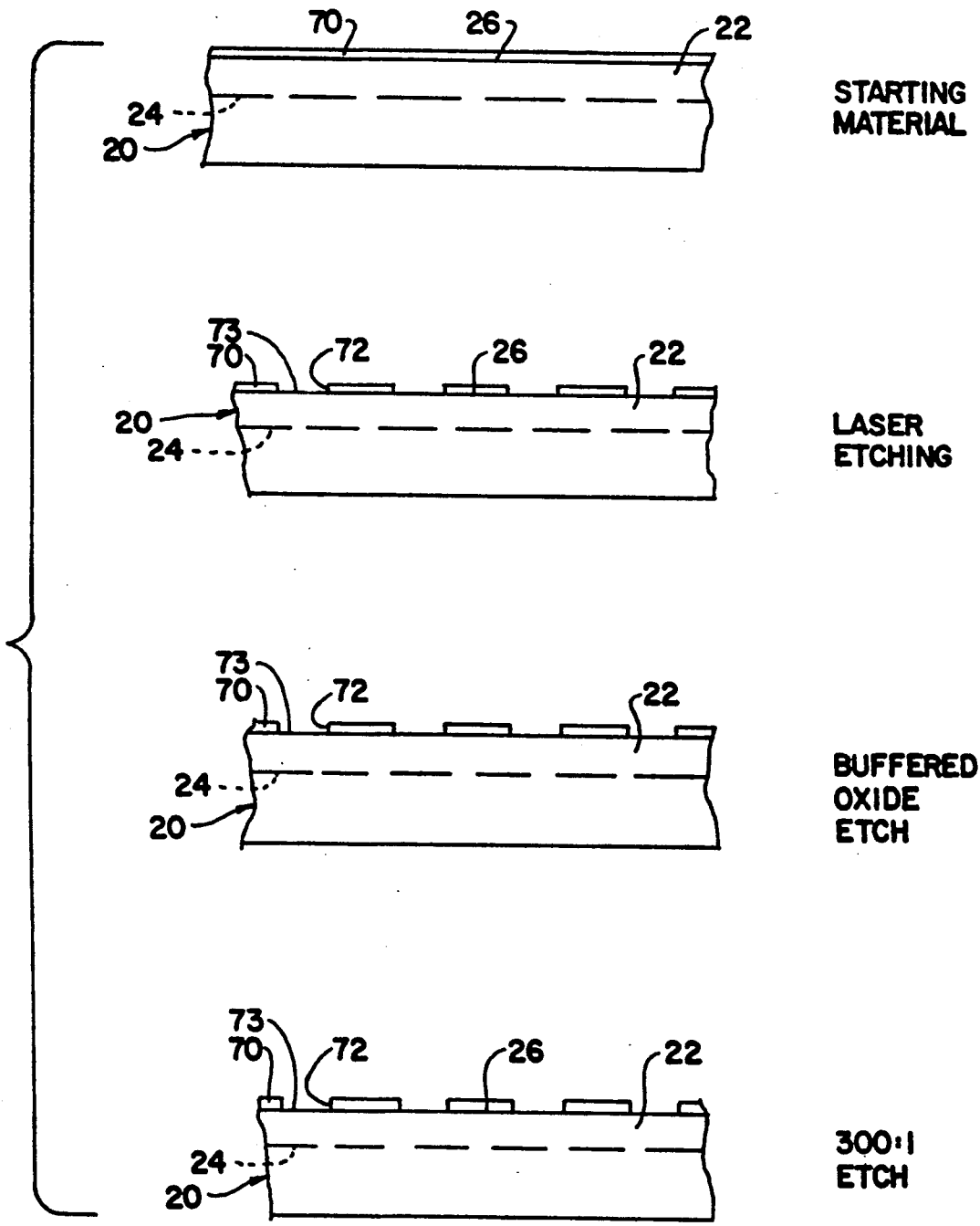
FIG. 1 illustrates the several steps involved in fabricating a pattern for metallization on a photovoltaic cell substrate according to the preferred embodiment of the present invention.

Referring to FIG. 1, the present invention is a process for forming metallization patterns on photovoltaic cell substrates having an outer coating of a deposited dielectric, e.g., silicon nitride, silicon dioxide, or a glass such as a phosphorous ($P_2O_5$)-doped glass, by removing selected portions of the coating with a laser beam. This removal exposes the underlying silicon substrate onto which conductors may be subsequently applied by a suitable metallization technique Since conductive materials tend not to adhere well to selected dielectrics such as silicon nitride, this selective removal of the dielectric layer creates a pattern for metallization to which conductors may be subsequently attached.

Referring to FIGS. 1 and 2, in the preferred embodiment of the present invention a silicon substrate 20, such as the type made from P-type silicon ribbon grown by the EFG (edge-defined film fed growth) process, is provided as the starting material. Preferably, substrate 20 comprises a relatively shallow N-type conductivity region 22, whereby a P/N junction 24 is located about 0.5 microns below front surface 26. Exemplary diffusion conditions for creating such a P/N junction 24 are well known, as evidenced by U.S. Pat. No. 4,612,698 to Gonsiorawski et al.

Referring again to FIG. 1, an outer coating 70 is preferably deposited on front surface 26. Coating 70 is a dielectric such as silicon nitride, silicon dioxide, or a glass such as a phosphorous ($P_2O_5$)-doped glass. Coating 70 is deposited by known processes so as to have a thickness of about 700 to 900 angstroms. For instance, when coating 70 is made of silicon nitride, the procedure described in U.S. Pat. No. 4,451,969 issued to A. R. Chauduri for "Method of Fabricating Solar Cells" may be satisfactorily employed as the method of depositing the coating.

Figure 2A:
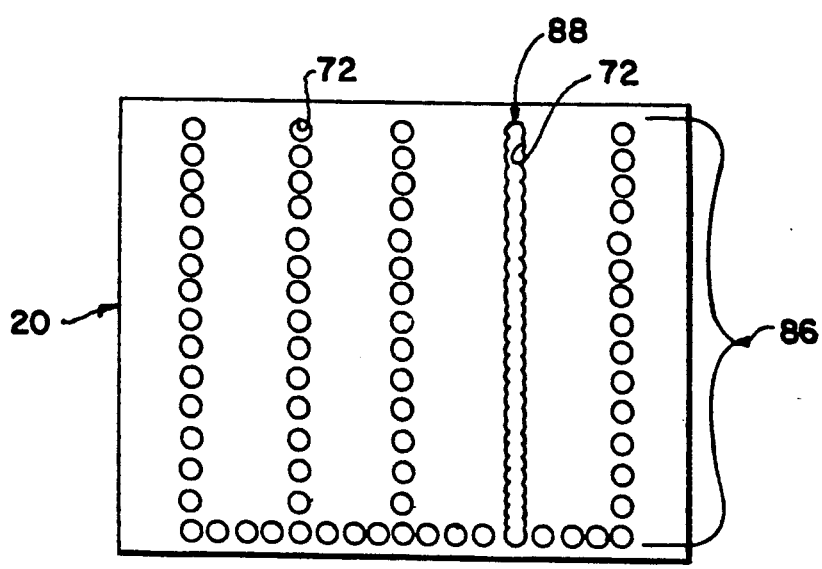
FIG. 2a is a plan view of a solar cell substrate schematically illustrating one embodiment of the metallization pattern of the present invention, with the diameter and spacing between the apertures of the metallization pattern being exaggerated for clarity of illustration.

Referring now to FIGS. 1, 2 and 2a pursuant to the second step of the present method, apertures 72 are formed in coating 70 by removing selected portions of the coating so as to expose portions 73 of substrate 20 using a laser beam 74 generated by a laser 76 positioned adjacent substrate 20. Preferably, laser 76 includes an optical assembly (not shown) for causing laser beam 74 to move bidirectionally along the orthogonal X and Y axes. Alternatively, substrate 20 may be mounted on a conventional X-Y table 80 to permit the substrate to be moved bidirectionally along the orthogonal X and Y axes relative to laser beam 74 Relative movement of substrate 20 and laser beam 74 is controlled so that the apertures 72 formed in coating 70 by the laser beam define a conventional multi-fingered solar cell electrode grid of the type disclosed in U.S. Pat. No. 3,686,036, as shown generally in FIG. 2a.

The intensity and duration of exposure of laser beam 74 are selected so as to effect removal of selected portions of the dielectric coating 70 so as to produce apertures 72. Laser 76 is controlled so that laser beam 74 does not form apertures in substrate 20 extending through P/N junction 24 or otherwise cause deterioration of junction 24. As a consequence of removing dielectric coating 70 so as to produce apertures 72, a grid pattern is formed in coating 70 to which conductors may be subsequently deposited on the substrate by immersion plating as described in U.S. Pat. No. 4,321,283 to Patel et al.

Preferably, although not necessarily, the laser etching step is performed in an inert atmosphere. To this end, substrate 20 is preferably enclosed in chamber 81 (FIG. 3), the interior of which is filled via chamber inlet 83 with an inert gas such as argon. Typically, the inert gas is injected into the chamber so as to wash across the top surface of the substrate. Preferably, the velocity of the feed gas is about 25 meters per minute.

The method of the present invention may be practiced satisfactorily using a neodium YAG (Nd:YAG) laser as the laser 76. The laser is controlled so as to have a radiation wavelength of 1.06 microns. Laser 76 is Q switched, and is operated so as to have a nominal pulse rate of about 10 kHz and a pulse width of about 260 nanoseconds. The laser 76 is operated so that its incident power is about 50 to 75 mega-watts per square centimeter. Additionally, laser 76 is controlled so that the effective radiation area generated by the laser is circular or substantially semi-circular, and has a diameter in the 20 to 250 micron range, with smaller diameters being preferred.

Laser beam 74 is caused to move relative to substrate 20, or vice versa, so as to form linear arrays of circular apertures in coating 70 each of which apertures correspond in size and configuration to the radiation spot of the laser beam. The circular apertures formed by laser beam 74 are separated, as shown by array 86 in FIG. 2a, or overlap slightly so as to form a series of elongate apertures 72, as shown by array 88 in FIG. 2a. As noted below, by separating the circular apertures slightly, the metal to silicon contact area of the electrode grid is reduced, whereby recombination losses are reduced.

Laser 76 may be operated in either the fundamental mode or in the multi-mode. In the fundamental mode there is a gaussian intensity across the entire spot, whereas in the multi-mode the intensity varies irregularly across the spot.

The radiation spot is moved relative to the substrate at a scan speed of between ¼ and 40 inches per second, with frequency and lamp current being adjusted with scan speed while maintaining incident power in the 50-75 mega-watt/cm$^2$ range.

The radiation spot is preferably moved relative to the substrate by selective control of the optical assembly associated with laser 76. Alternatively, the radiation spot may be fixed and the substrate moved relative thereto by appropriate manipulation of X-Y table 80.

The exact nature of the physical and/or chemical reaction between laser beam 74 and dielectric coating 70 responsible for removing selected portions from the coating 70 so as to expose portions 73 of substrate 20 is not entirely understood It is believed however, that when the dielectric coating 70 is made from silicon nitride, that the Nd:YAG laser beam removes silicon coating 70 by a combination of melting and evaporation.

Removal of selected portions of coating 70 using laser beam 74 additionally serves to drive portions of the p/n junction positioned below exposed portions 73 of substrate 20 more deeply into the substrate. For example, a substrate having an N+ region extending about 0.7 microns below upper surface 26 of substrate 20 was exposed to laser beam 74 in the manner discussed above. After the laser beam exposure, portions of the p/n junction positioned below exposed portions 73 of substrate 20 were found to be located about 3 microns below top surface 26 of the substrate. By providing locally deep junctions, the surface of exposed portions 73 can be removed by chemical etching processes, as discussed below, without decreasing the thickness of the N+ layer below exposed portions 73 to an unacceptably thin level. This advantage associated with locally deep junctions is especially important when the p/n junction is positioned close to the surface of the substrate, e.g. to enhance blue sensitivity of the solar cell. Additionally, recombination losses are reduced in the solar cell by driving the portions of the p/n junction positioned beneath exposed portions 73 more deeply into the substrate.

Again referring to FIG. 1, as the next step in the method of the present invention, substrate 20 is preferably immersed for a selected period of time in a conventional buffered oxide etch solution of the type used widely in the semiconductor industry. A suitable buffered oxide etch solution comprises by weight, 40% ammonium fluoride buffering salts, 10-12% hydrofluoric acid by weight, and water. Substrate 20 is preferably immersed for about 30 seconds in a buffered oxide etch solution maintained at a temperature of about 20° C. The length of the immersion will, of course, vary with the temperature and composition of the buffered oxide etch solution. Then, substrate 20 is removed from the buffered oxide etch and is rinsed with de-ionized water. The buffered oxide etch removes silicon dioxide present on the exposed portions 73 of substrate 20.

Thereafter, as the following step, substrate 20 is immersed for a selected period of time in a high ratio etch comprising nitric acid and hydrofluoric acid in a ratio of between about 50:1 to 1000:1 by volume, preferably about 300:1 by volume. Substrate 20 is immersed in the high ratio etch for a period of time that will vary with the temperature of the etch. Preferably, when a 300:1 etch is used the etch is maintained at a temperature of about 12° C. and substrate 20 is immersed for about 20 seconds. Immersion times of about 8-15 seconds are adequate when the 300:1 etch is maintained at room temperature. The substrate 20 is then removed from the high ratio etch and is rinsed with de-ionized water. The high ratio etch removes any residual silicon nitride present on portions 73 of substrate 20 exposed by the formation of apertures 72 in dielectric coating 70.

The residual silicon dioxide and silicon nitride removed by the buffered oxide etch and the high ratio etch tend to adversely affect the adherence of metal electrodes attached by immersion plating. Consequently, the buffered oxide etch and high ratio etch steps are performed to ensure that the electrodes attached by immersion plating adhere securely to the sections of substrate 20 exposed by removal of portions 72 from dielectric coating 70. Under certain conditions and for certain applications, however, it may be possible to obtain adequate adherence of the metal electrodes to the exposed portions 73 of substrate 20 without immersing the substrate in the buffered oxide etch and high ratio etch. Thus, the latter steps should be regarded as preferred but not critical. Additionally, the buffered oxide etch step may be omitted by increasing the length of the high ratio etch. When the buffered oxide etch step is omitted, the length of the high ratio etch step must not be increased to a point where over-etching of the substrate occurs.

It appears that when the size of the radiation spot formed by laser beam 74 is at the smaller end of the range identified above (i.e. about 20–30 microns in diameter), the portions 73 of substrate 20 exposed by the formation of apertures 72 in coating 70 using the small radiation spot are pristine clear, i.e. no residual silicon nitride or silicon dioxide is present. As such, it is believed that the buffered oxide etch and high ratio etch steps should not be required when the radiation spot produced by laser beam 74, and hence the width of conductors deposited in apertures 72, is small (narrow). However, for reasons that are not fully understood, even when apertures 72 are formed in coating 70 using a small radiation spot, better conductor adherence is achieved when the buffered oxide etch and high ratio etch steps are performed subsequent to the laser etching step.

The preferred embodiment of the method of the present invention comprises the above-described steps using an Nd:YAG laser for forming metallization patterns in a substrate used in fabricating solar cells. Additional processing of the substrate is, of course, required to complete a finished solar cell.

FIG. 3 illustrates a comprehensive method of forming solar cells incorporating the method of forming metallization patterns described above. In this comprehensive method, a silicon substrate 20 of the type illustrated in FIG. 1 and described above is provided as the starting material. Substrate 20 comprises a P/N junction 24, a top surface 26, and a dielectric outer coating 70.

As the second step, apertures 72 are formed in coating 70 with a laser beam 74 generated by a laser 76 in the manner described above with respect to the method of forming metallization patterns illustrated in FIG. 1.

As the next step in completing a finished solar cell, the rear side of substrate 20 is coated with a layer 84 of aluminum.

The aluminum used to form layer 84 preferably comprises aluminum powder in a volatile organic vehicle, such as terpineol, that can be removed by evaporation and heating. The aluminum layer may be applied by screen printing, wherein a viscous aluminum paste is pressed through the openings in a screen placed in contact with the rear side of the substrate 20, or by evaporative deposition.

This coating step includes an alloying step in which the substrate is heated for about 0.25 to 2.0 minutes to a temperature greater than 575° C. to remove any volatile or pyrolyzable organic components of the paste and to alloy the aluminum in the paste to the silicon substrate. In this alloying step, if the substrate has an N+ region at the back side thereof, the aluminum coating 84 alloys with the back side of the substrate annihilating the N+ region and forming a P+ region 86 having a depth of from 1 to about 10 microns.

The following step involves immersing the substrate 20 in the buffered oxide etch for a suitable period of time and then removing the substrate and rinsing it with de-ionized water. This step is identical to the buffered oxide etch step described above with respect to the method of making metallization patterns.

As the next step, the substrate 20 is immersed in the high ratio etch for a suitable period of time and then is removed and rinsed with de-ionized water. This step is also identical to the high ratio etch step described above in connection with the description of the method of making metallization patterns.

Next, as illustrated in FIG. 3, a grid electrode is applied to exposed portions 73 of substrate 20. The grid electrode is deposited by immersion plating of nickel, in accordance with the process disclosed in U.S. Pat. No. 4321283 to Patel et al. This plating forms a nickel layer 88 over the entire aluminum layer 84 and a nickel layer 90 within apertures 72 and not on the surface of dielectric coating 70. Thus, as discussed above, the dielectric coating 70 acts as a plating mask to which nickel applied by immersion plating does not adhere securely.

Other well known procedures, such as pre-activating the surface of the silicon substrate with gold chloride, are typically performed in conjunction with the metallization step. These and other well known procedures are described in U.S. Pat. No. 4612698.

After the nickel has been applied, the substrate is heated in an inert or a nitrogen atmosphere to a temperature and for a time sufficient to sinter the nickel layers and cause the nickel layer 90 on the front side of the substrate to react with the adjacent silicon to form a nickel silicide ohmic contact. For this purpose, the substrate is preferably heated to a temperature of about 300° C. for between about 15 and about 40 minutes. This provides a nickel silicide layer with a depth of about 300 Angstrom units at the interface between nickel layer 90 and substrate 20. The nickel layer 88 on the rear side forms an alloy with aluminum layer 84. The temperature of this sistering step should not greatly exceed 300° C., as higher temperatures lead to excessive penetration into the silicon of nickel layer 88. Preferably, the deposition and sintering of the nickel is controlled such that nickel layer 90 on the front side of the substrate has a thickness of about 1000 Angstrom units.

Thereafter, the nickel of layers 88 and 90 are preferably subjected to etching, as with nitric acid, to remove unbonded nickel, and to further metallization, as with successive layers of nickel and copper by techniques well known in the art. No masking of the dielectric coating 70 is required for the nickel and copper plating since the nickel and copper will not adhere to the coating.

Following metallization, the cell edges (not shown) are trimmed.

It has been determined that solar cells fabricated according to the present invention have an efficiency of about 12 to 14.5%.

As compared to the method of U.S. Patent Application Ser. No. 387,854 mentioned above, the present method possesses the important advantage that conductors deposited on a silicon substrate by immersion plating will remain securely and permanently attached to the substrate.

Another important advantage associated with the present invention is that recombination losses are reduced in solar cells fabricated in accordance with the foregoing procedure. Two factors are believed account for this reduction. First, it appears that recombination losses are reduced by driving the portions of the p/n junction located beneath the electrode grid more deeply into the substrate. Second, by causing the radiation spot to move across coating 70 so that the circular apertures formed in coating 70 are spaced apart from one another a distance such that a small amount of silicon nitride remains positioned between adjacent apertures, as shown schematically by the array of apertures 86 in FIG. 2a, the metal to silicon contact area of the electrode grid is reduced. This reduction in metal to silicon contact area is also believed to reduce recombination losses.

Yet another important advantage associated with the present invention is that a solar cell having relatively narrow (e.g. 30 microns) electrode fingers can be formed using the present method. Relatively narrow fingers are advantageous because they cast a smaller shadow on the surface of the solar cell which maximizes the surface area of the substrate available to receive light.

Although the present invention has been described as preferably employing an immersion plating process such as disclosed by Patel et al. for electrode deposition, other processes may also be advantageously used, e.g., electroless plating. To achieve suitable results, however, the alternative metallization processes must be such that the deposited conductive materials adhere poorly or not at all to a layer of a deposited dielectric such as silicon nitride. At the same time the metallization process must be such that the deposited metal adheres securely to a clean surface of the silicon substrate While nickel is the preferred metal plating material, other conductive materials such as cobalt, copper, palladium, platinum and rhodium may be used to form electrodes.

It is preferred to incorporate the present method of forming metallization patterns in a comprehensive process for fabricating solar cells in the sequence described above and illustrated in FIG. 3 for at least two reasons. First, by performing the backside metallization subsequent to the laser etching step, the possibility of the laser beam heating up the substrate sufficiently to cause the aluminum layer 84 to be driven into the substrate more deeply than desired is avoided. Second, by performing the backside metallization prior to the etching steps, the need to dry the substrate prior to performing backside metallization is avoided.

Although for these reasons it is preferred to create solar cells in the sequence described above and illustrated in FIG. 3, satisfactory solar cells can also be fabricated with differing sequences of fabrication steps. For instance, the backside metallization step could be performed prior to the laser etching, especially where the intensity and duration of exposure to the laser beam are controlled to minimize penetration of the aluminum backing layer 84. Similarly, by drying the substrate subsequent to the high ratio etch and de-ionized water rinse step, backside metallization could be satisfactorily performed after the high ratio etch and rinse step.

The present invention is also useful in cases where the substrate has been subjected to hydrogen passivation at its upper surface 26.

The process of the present invention is not limited to the fabrication of solar cells. Thus, it may be used in the formation of other types of semiconductor devices using single crystal or polycrystalline silicon substrates.

Since certain changes may be made in the steps of the process hereinabove described without departing from the scope of the invention, it is intended that all matter contained in the above description or shown in the accompanying drawing shall be interpreted in an illustrative and not in a limiting sense.

As used in the following claims, the term "dielectric" shall mean and include such dielectric materials as silicon nitride, silicon dioxide and phosphorus glass.

As used in the following claims, unless otherwise indicated, the term "layer" shall mean a discrete coating deposited on a silicon substrate.

What is claimed is:

1. A method of forming a pattern for metal deposition on a photovoltaic cell substrate comprising in sequence the steps of:
   (a) providing a silicon substrate having a dielectric layer on one side thereof, said substrate having a P/N junction formed therein adjacent said one side;
   (b) subjecting said dielectric layer to a laser beam of an intensity and for a duration sufficient to eliminate selected portions of said dielectric layer and thereby expose sections of said silicon substrate without forming apertures in said substrate extending through said P/N junction or otherwise causing degradation of said P/N junction, said selected portions of said dielectric layer being eliminated in an environment that is substantially free of gaseous, liquid or solid chemical etching substances; and
   (c) immersing said silicon substrate in at least one selected etchant for a predetermined period of time, said etchant and period of time being selected so that said etchant will remove substantially all residual silicon nitride and silicon oxide deposits on the sections of said silicon substrate exposed by elimination of said selected portions of said dielectric layer.

2. A method according to claim 1 wherein said dielectric layer is made of silicon nitride.

3. A method according to claim 1 wherein said dielectric layer is made of glass.

4. A method according to claim 1 wherein said laser beam is generated by a Nd:YAG laser.

5. A method according to claim 1 wherein said subjecting step is effected by moving said laser beam relative to said substrate, and further wherein said laser beam is pulsed on and off in sequence with movement of said substrate so as to create a pattern for metallization comprising the image of a conventional solar cell grid electrode.

6. A method according to claim 1 wherein said intensity and duration of exposure of said laser beam are additionally selected so as drive those portions of said P/N junction positioned below said selected portions deeper into said substrate.

7. A method according to claim 4 wherein said silicon substrate is polycrystalline silicon produced by the EFG process.

8. A method according to claim 1 wherein said selected portions of said substrate are eliminated by said laser beam in a substantially inert atmosphere.

9. A method according to claim 1 wherein said subjecting step includes eliminating a plurality of substantially circular portions of said dielectric layer so as to expose said sections of said silicon substrate, said plurality of substantially circular portions together defining said selected portions.

10. A method according to claim 9 wherein said plurality of substantially circular portions are aligned in one or more rows.

11. A method according to claim 9 wherein each of said plurality of circular portions is spaced from adjacent circular portions.

12. A method according to claim 9 wherein each of said plurality of circular portions overlaps adjacent circular portions.

13. A method according to claim 11 wherein said circular portions have a diameter ranging from 20 to 250 microns and adjacent circular portions are spaced apart 0 (zero) microns to 15 microns.

14. A method according to claim 1 wherein said immersing step comprises:
immersing said substrate in a buffered oxide etch; and
removing said substrate from said buffered oxide etch after said substrate has been immersed therein for a selected period of time.

15. A method according to claim 14 wherein said buffered oxide etch comprises ammonium fluoride buffering salts, water and 10–12% hydrofluoric acid by weight.

16. A method according to claim 14 wherein said selected period of time is equal to about 30 seconds when said buffered oxide etch is maintained at a temperature of about 22° C.

17. A method according to claim 14 wherein said selected period of time is chosen so that said buffered oxide etch removes substantially all of the silicon dioxide present on the sections of said substrate exposed by said elimination of said selected portions of said dielectric layer.

18. A method according to claim 14 further including the step of rinsing said substrate in de-ionized water after said substrate has been removed from said buffered oxide etch.

19. A method according to claim 1 wherein said immersing step comprises:
immersing said substrate in a high ratio etch comprising nitric acid and hydrofluoric acid; and
removing said substrate from said high ratio etch after said substrate has been immersed therein for a selected period of time.

20. A method according to claim 19 wherein the ratio of nitric acid to hydrofluoric acid in said high ratio etch ranges from 50:1 to 1000:1.

21. A method according to claim 19 wherein the ratio of nitric acid to hydrofluoric acid in said high ratio etch is about 300:1.

22. A method according to claim 19 wherein said selected period of time is equal to about 20 seconds when said high ratio etch is maintained at a temperature of about 12° C.

23. A method according to claim 19 wherein said selected period of time is chosen so that said high ratio etch removes substantially all of the silicon nitride present on the sections of said substrate exposed by said elimination of said selected portions of said dielectric layer.

24. A method according to claim 19 further including the step of immersing said substrate in de-ionized water after said substrate has been removed from said high ratio etch.

25. A method according to claim 14 including, following removal of said substrate from said buffered oxide etch, the steps of:
immersing said substrate in a high ratio etch comprising nitric acid and hydrofluoric acid; and
removing said substrate from said high ratio etch after said substrate has been immersed therein for a selected period of time.

26. A method of forming a metallization pattern on a photovoltaic cell substrate comprising in sequence the steps of:
(a) providing a flat silicon substrate having a P/N junction formed therein adjacent one side thereof and a layer of silicon nitride covering said one side;
(b) scanning selected portions of said silicon nitride layer of said substrate with a laser beam of an intensity and for a duration sufficient to remove said selected portions and expose selected areas of said one side to which electrodes may be deposited, said selected portions being removed in an environment substantially free of chemical etching substances;
(c) immersing said substrate in a buffered oxide etch solution for a period of time sufficient to remove residual silicon dioxide on said selected areas; and
(d) immersing said substrate in a high ratio etch comprising nitric acid and hydrofluoric acid for a period of time sufficient to remove residual silicon nitride on said selected areas.

27. A method according to claim 26 wherein said scanning step includes removing from said dielectric layer a plurality of substantially circular portions arranged so as to form at least one row, said plurality of circular portions defining said selected portions.

28. A method according to claim 26 further wherein said first immersing step comprises removing said substrate from said buffered oxide etch after said selected period of time and rinsing said substrate with de-ionized water, and said second immersing step comprises removing said substrate from said high ratio etch solution after said selected period of time and rinsing said substrate with de-ionized water.

29. A method of fabricating solar cells comprising in sequence the steps of:
(a) providing a silicon substrate having a dielectric layer on one side thereof, said substrate having a P/N junction formed therein adjacent said one side;
(b) subjecting said dielectric layer to a laser beam of an intensity and for a duration sufficient to eliminate selected portions of said dielectric layer and expose selected sections of said substrate, said selected portions of said dielectric layer being eliminated in an environment that is substantially free of gaseous, liquid or solid chemical etching substances;
(c) applying an aluminum layer to an opposite side of said substrate;
(d) immersing said substrate in a buffered oxide etch;
(e) removing said substrate from said buffered oxide etch after said substrate has been immersed therein for a selected period of time;
(f) immersing said substrate in a high ratio etch comprising nitric acid and hydrofluoric acid;
(g) removing said substrate from said high ratio etch after said substrate has been immersed therein for a selected period of time; and
(h) plating a nickel layer over (a) sections of said substrate exposed by removal of said selected portions of said dielectric layer and (b) said aluminum layer.

30. A method according to claim 29 wherein said subjecting step includes eliminating a plurality of substantially circular portions of said dielectric layer so as to expose said selected sections of said substrate, said plurality of circular portions (a) being positioned in a row and (b) defining said selected portions of said dielectric layer.

31. A method according to claim 14 wherein said buffered oxide etch comprises by weight about 40% ammonium fluoride buffering salts, 11% hydrofluoric acid, and 49% water.

* * * * *

UNITED STATES PATENT AND TRADEMARK OFFICE
CERTIFICATE OF CORRECTION

PATENT NO. : 5,011,567
DATED : April 30, 1991
INVENTOR(S) : Ronald C. Gonsiorawski et al It is certified that error appears in the above-identified patent and that said Letters Patent is hereby corrected as shown below:

On the title page, item [75] Inventor: "Christopher Dube, Arlington, Mass." should be added as an inventor, after -- Ronald C. Gonsiorawski, Danvers, Mass. --.

Signed and Sealed this

Twenty-second Day of September, 1992

Attest:

DOUGLAS B. COMER

Attesting Officer

Acting Commissioner of Patents and Trademarks